United States Patent [19]

Redeker et al.

[11] Patent Number: 5,800,621

[45] Date of Patent: Sep. 1, 1998

[54] PLASMA SOURCE FOR HDP-CVD CHAMBER

[75] Inventors: Fred C. Redeker, Fremont; Tetsuya Ishikawa, Santa Clara, both of Calif.

[73] Assignee: Applied Materials, Inc., Santa Clara, Calif.

[21] Appl. No.: 795,169

[22] Filed: Feb. 10, 1997

[51] Int. Cl.$^6$ .................................................. C23C 16/00
[52] U.S. Cl. .................... 118/723 AN; 118/723 I; 156/345; 315/111.51
[58] Field of Search ............... 118/723 R, 723 I, 118/723 IR, 723 AN; 156/345; 204/298.31, 298.34, 298.06; 315/111.21, 111.51, 111.71

[56] References Cited

U.S. PATENT DOCUMENTS 4,948,458  8/1990  Ogle .
5,401,350  3/1995  Patrick et al. .
5,435,881  7/1995  Ogle .
5,522,934  6/1996  Suzuki et al. ................. 118/723 AN Primary Examiner—R. Bruce Breneman
Assistant Examiner—Luz Alejandro
Attorney, Agent, or Firm—Patterson & Streets, L.L.P.

[57] ABSTRACT

A plasma system is disclosed for processing a substrate and includes a chamber body defining a plasma cavity therein and having a centrally located gas inlet, and a top antenna configured in position relative to the plasma cavity to produce a center-peaked plasma density profile above the substrate during operation. The top antenna has a central passage which surrounds the centrally located gas inlet. A side antenna is preferably configured and positioned relative to the plasma chamber to produce a hollow-center plasma density profile above the substrate during operation. Together, the top and side antennas and the centrally located gas inlet provide a uniform plasma directly over the surface of the substrate to be processed.

9 Claims, 2 Drawing Sheets

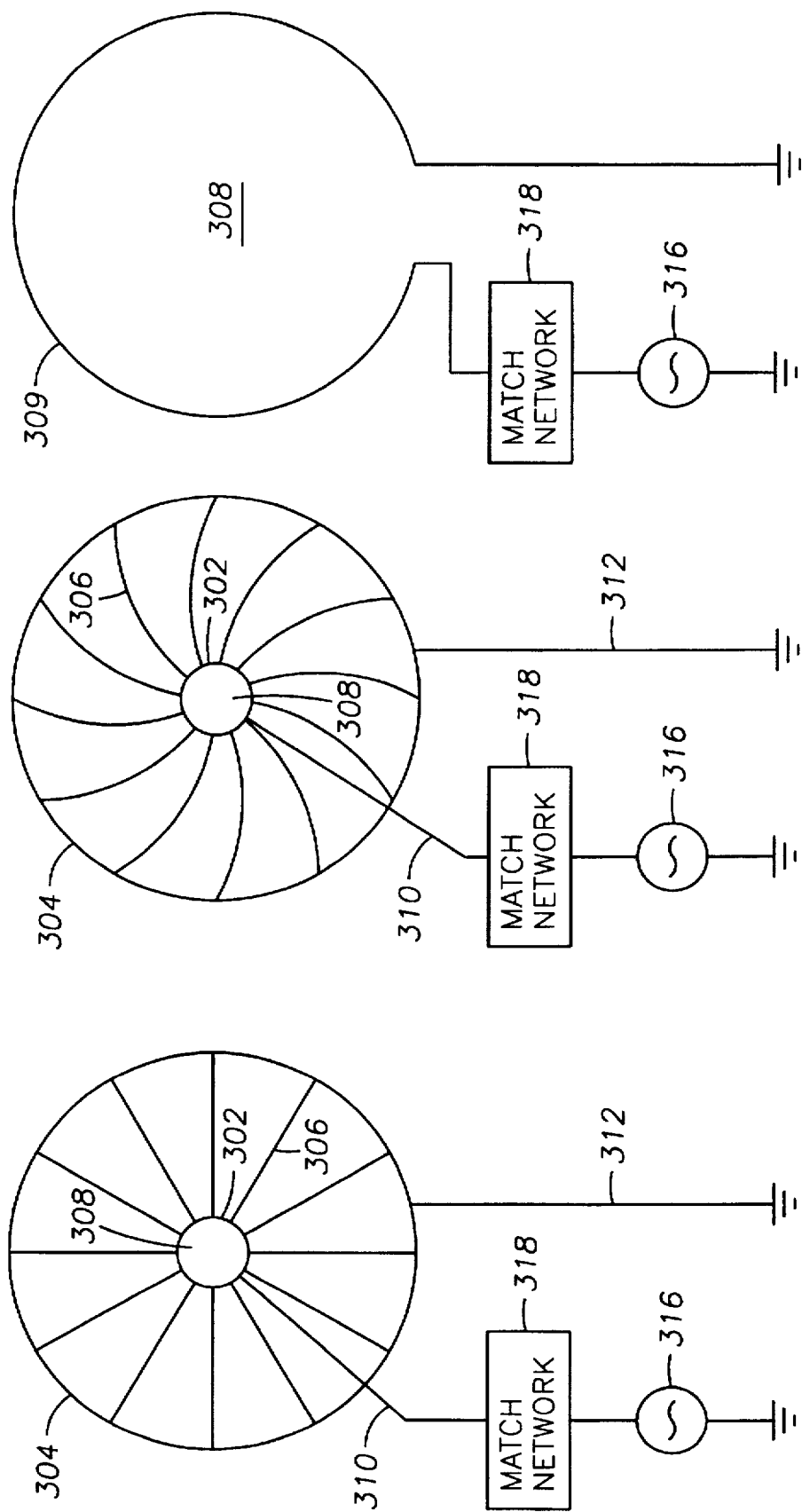

PLASMA SOURCE FOR HDP-CVD CHAMBER

FIELD OF THE INVENTION

The present invention relates to a plasma source for use in plasma enhanced chemical vapor deposition (PECVD) chamber, and more particularly, for a plasma source in which the radial plasma density profile in a generally cylindrical plasma geometry can be controlled.

BACKGROUND OF THE INVENTION

It has been found advantageous in the chemical vapor deposition (CVD) art used in making integrated circuits to utilize high density plasmas to enhance chemical deposition, etching, or cleaning reactions in a substrate or substrate processing chamber. It is well known that high density plasma (i.e., $1 \times 10^{11}$ to $2 \times 10^{12}$ ions/cm$^3$) wherein low energy bombardment of the processing surface (i.e., electron temperature $T_e$~ a few electron volts or eV) is attainable by use of inductively coupled plasma sources.

In the prior art inductive plasma sources, a helical antenna coil is typically wound about the exterior surface of a dielectric (quartz) dome or cylinder forming a portion of the vacuum processing chamber. An RF current (i.e., from about 100 KHz to about 100 MHZ) is passed through the antenna coil. When operated in a resonance mode with the applied RF power, an RF current, IRF, circulating in the antenna coil generates an axial RF magnetic field, $B_{RF}$, within the processing chamber volume antenna coil. This magnetic field, $B_{RF}$, induces a circulating RF electron current in the gas in the enclosed chamber to maintain a high energy plasma in the gas, once the plasma is lit (i.e., once the gas becomes partially ionized by electron collisions). The configuration formed may be considered an RF transformer with the antenna coil acting as the primary winding and the plasma, itself, acting as the secondary winding.

Such inductively coupled plasmas in the process chamber volume above a substrate tend to be non-uniform and annular in shape, having lower plasma density over the center portion of the processing surface. This "hollow center" effect can be alleviated by providing a top or cover antenna coil over the top portion of the dielectric cover of the processing chamber. Such top antenna coils have, in the prior art, been generally spirally wound and have not been used in conjunction with a gas inlet disposed through the top of the chamber. One example is found in U.S. Pat. No. 5,401,350, entitled "Coil Configuration for Improved Uniformity in Inductively Couple Plasma System". A centrally located gas inlet disposed through the top of the chamber has been found to enhance uniform deposition. One chamber which utilizes a center gas feed is the Ultima™ HDP-CVD chamber available from Applied Materials. This chamber utilizes a top and side coil to enable tuning of the power delivered to the chamber and enhance uniformity of the plasma.

It is an object of the present invention to provide an improved top antenna coil for a PECVD chamber which improves uniformity in a magnetic field generated above a substrate positioned in the chamber. It is a further object of the invention to provide an HDP-CVD chamber having improved uniformity across a plasma maintained above a substrate positioned in the chamber.

SUMMARY OF THE INVENTION

The present invention provides a top antenna coil for a plasma chamber which is configured and disposed adjacent to the plasma chamber to produce a "center-peaked" plasma density profile above a substrate being processed in the chamber. The antenna is further configured to have a central passage through which a gas inlet delivers one or more processing gases into the chamber above the substrate. The central passage in the antenna is formed by an annular coil turn or an annular loop.

The invention further provides an HPD-CVD chamber which combines a top antenna coil of the invention with a side antenna coil configured to produce a "hollow-center" plasma density profile above a substrate being processed in the chamber. RF power is supplied to the top antenna coil and the side antenna coil from either separate RF power sources or through a power splitter network on a single RF power source to adjust the superposition of the RF magnetic fields from the top antenna coil and the side antenna coil can be adjusted for a particular application to provide a uniform plasma density (and hence uniform deposition or etch) across the surface of the substrate to be processed.

The present invention also allows operating with an electropositive or an electronegative plasma without experiencing excessive nonconformity in the plasma density profile. In addition, the present invention provides a plasma source which has a wide window of uniform density operation and allows the user to vary the density profile over a wide range of process conditions.

Other advantages and features will become apparent from the following description of the preferred embodiments and from the claims.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of is scope, for the invention may admit to other equally effective embodiments.

FIG. 2 is a schematic diagram illustrating one embodiment of a top antenna coil according to the present invention having an inner annular coil turn and a concentric outer coil turn;

FIG. 3 is a schematic diagram illustrating another embodiment of a top antenna coil having concentric annular coil turns; and FIG. 4 is a schematic diagram illustrating another embodiment of a top antenna coil having a single loop turn.

DESCRIPTION OF THE PREFERRED EMBODIMENTS

Figure 1:
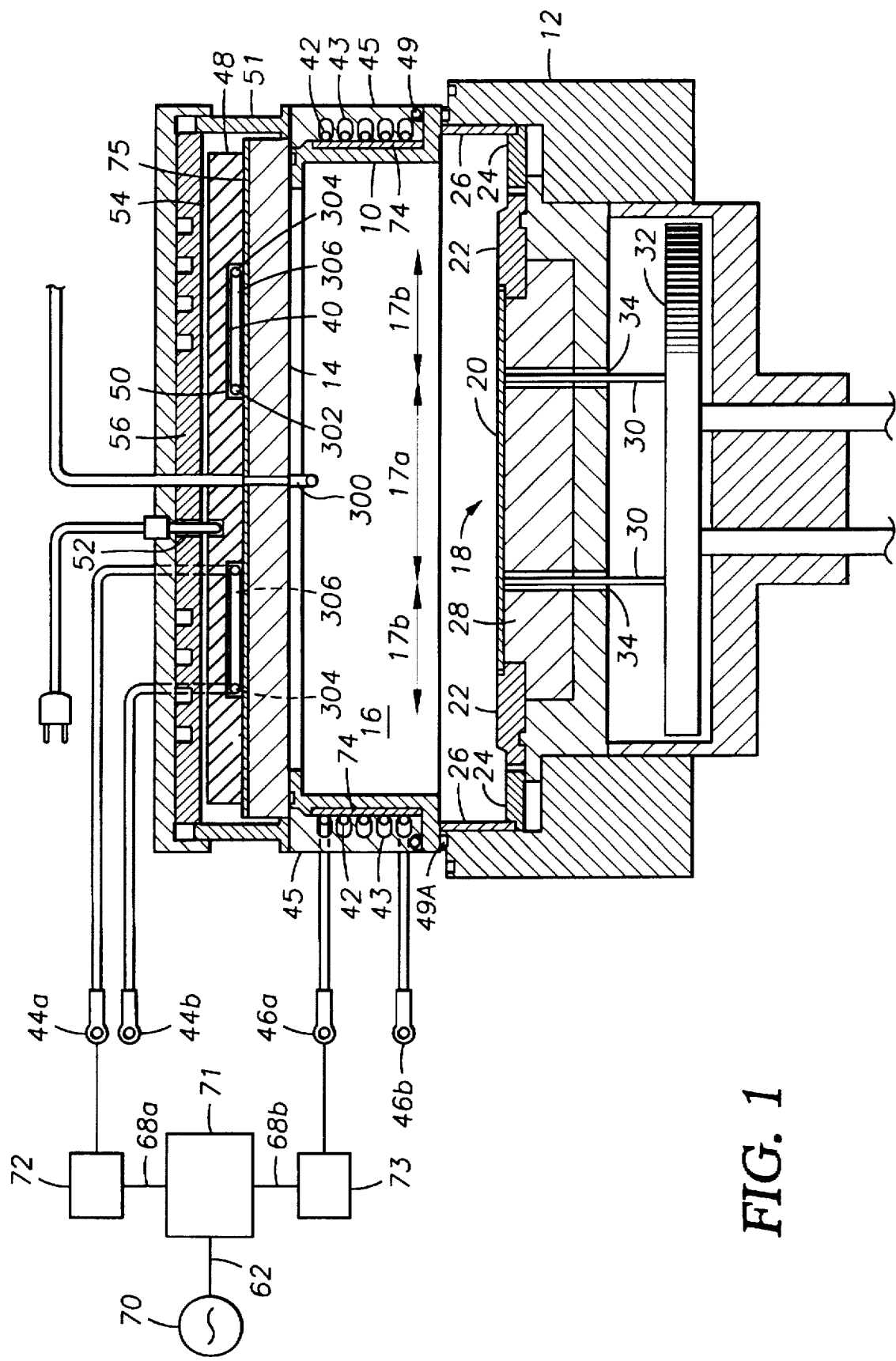
FIG. 1 is a schematic cross sectional view showing a plasma enhanced CVD processing system employing a top antenna coil of the present invention.

The present invention provides an antenna for generating a plasma within a processing chamber having a top and sidewalls, and preferably one or more gas inlets peripherally and centrally located in the side and top of the chamber, respectively. Preferred embodiments of the antenna comprise a central annular coil turn defining a central passage through the antenna, an outer annular coil turn concentrically aligned with the central annular coil turn, and a plurality of conductors extending between the central annular coil turn and the outer annular coil turn. The conductors preferably extend between the coil turns in a radial path or an arcuate path. An alternative embodiment of the antenna provides a loop turn having first and second leads extending from a single loop turn. The antennas are described in more detail below in combination with a CVD chamber which uses the antennas of the present invention to generate a plasma for uniform processing of substrates.

FIG. 1 is a schematic cross sectional view of a CVD substrate processing system. A generally cylindrical dome 10 made of a dielectric material, such as quartz, ceramic, for example, $Al_2O_3$ or the like, is mounted on a vacuum chamber body 12. At one end of the cylindrical dome 10 there is a flange which abuts against and, with the aid of an 0-ring 49A, forms a vacuum seal with the chamber body 12. A circular dielectric plate 14 seals the other end of the dome 10, thereby forming a sealed processing cavity 16 in which plasma processing takes place. The cylindrical dome 10 and the dielectric plate 14 combination is also generally referred to as a dome. Both are transparent to RF power which is coupled into the chamber by appropriately positioned antennas which are described below.

Inside the plasma processing cavity 16 there is an electrostatic chuck assembly 18 which holds a substrate during processing. The outer perimeter of the e-chuck 18 is protected from the corrosive effects of the plasma and from current leakage between the e-chuck and the plasma by a dielectric collar or ring 22 that surrounds the e-chuck 18. Beyond the dielectric collar or ring 22 is an annular plate 24 and a cylindrically-shaped liner 26 which protect the rest of the interior surfaces of the chamber body 12 from the plasma during operation. The annular plate 24 and the liner 26 are made of either a dielectric material (e.g., quartz, $Al_2O_3$, or other ceramic) or a conductive material (e.g., silicon carbide, graphite, carbon fiber material, or aluminum, etc.) depending upon the particular processing application and other design considerations. In the described embodiment, where dielectric plate 14 is made of $Al_2O_3$ or AlN, both plate 24 and liner 26 are made of a conductive material to provide sufficient conductive area for a return path for the RF bias current that is applied to the e-chuck 18.

The e-chuck 18 includes a metal pedestal 28 with a dielectric/insulating layer 20 formed on its top surface. By applying an RF bias voltage to the e-chuck 18 relative to the plasma that forms above it, the resulting electrostatic field that is formed across the dielectric layer 20 holds the substrate firmly against the top of the e-chuck. In the described embodiment, a cooling gas (e.g., helium) is supplied through conduits (not shown) within the body of the e-chuck to the backside of the substrate to facilitate heat transfer between the substrate and the pedestal 28.

Pins 30 that are connected to a movable platform 32 in the bottom of the chamber extend upwardly through holes 34 that pass through e-chuck 18 and are used to lower the substrate onto the e-chuck prior to plasma processing and to lift the substrate off of the e-chuck thereafter. A pneumatic or motor assembly (not shown) located beneath the chamber raises and lowers the movable platform 32.

RF power is supplied to the plasma cavity 16 through one or more antennae, namely, a top antenna coil 40 and optionally a side antenna coil 42. Both antenna coils 40, 42 are preferably made of copper wire, but may be made of any highly conductive material. Top antenna coil 40 is a flat coil that is located adjacent to the topside of the dielectric plate 14 and configured to allow a gas inlet 300 to be disposed through the dielectric plate 14. Side antenna coil 42 is a cylindrically shaped coil that is wound around the outside wall of the cylindrical dome 10. RF power is supplied to the top antenna coil 40 through an antenna connection 44a and to the side antenna coil 42 through an antenna connection 46a. The RF power may be supplied from a single RF power source 70 as shown, via a splitter 71 and two matching networks 72, 73 or from two separate RF power supplies. The antenna coils 40, 42 are grounded through other antenna connections 44b, 46b, respectively.

An insulator cover plate 48 covers the top antenna coil 40 in grooves 50 formed in its bottom surface which have the same shape as the top antenna 40 and which completely contain the top antenna 40 when the cover plate 48 is placed onto the dielectric plate 14. A Faraday shield 75 (comprising a conductive, non-magnetic metal) is disposed between the top coil 40 and the dielectric plate 14. Cover plate 48 mechanically holds the top antenna coil 40 in a fixed position relative to the chamber and electrically isolates the turns of the coil so that arcing between turns does not occur. Cover plate 48 may include a heating element 52 to heat the lid. Immediately above and adjacent to cover plate 48 there is an air gap 54 and a cooling assembly 56 which acts as a heat sink for the heat that is dissipated by the heated cover plate 48. Heating element 52 and heat transfer assembly 56 are used to heat or cool and maintain the temperature of the cover plate 48 and the dielectric plate 14 at a predetermined level during operation.

A cylindrical sleeve 45 surrounds the cylindrical dome 10 and includes grooves 43 formed in its inside surface for holding the turns of the side antenna coil 42. Sleeve 45 provides mechanical stability and positioning of the turns relative to the chamber and provides insulation between turns of the coil which prevent arcing. A Faraday shield 74 comprising a conductive, non-magnetic metal is disposed between the side coil 42 and the cylindrical dome 10 and is slotted to prevent current circulation similar to top coil Faraday shield 75.

Near the bottom of the sleeve 45, there is a heater element 49 which provides indirect heating to the wall of cylindrical dome 10 to stabilize the plasma process. A heat conducting collar 51, which is located above and contacts the top of the sleeve 45, provides a heat sink for the heated sleeve by creating a heat flow path up to the cooling assembly 56 at the top of the chamber. For example, in some processes it is desirable to heat the chamber wall (e.g., heated to about 200° C.) so that precursor gases introduced into the chamber deposit on the substrate rather than on the wall of the dome 10. In the described embodiment, both the dielectric sleeve 45 and the cover plate 48 are made of ceramic, e.g., alumina or $Al_2O_3$, but other materials known in the art may be used.

The top antenna coil 40 which will be discussed in more detail below delivers RF power in a proportionally larger amount to the center region 17a of cavity 16 as compared to an outer perimeter region 17b that surrounds the center region 17a. If used by itself, top antenna coil 40 is configured and positioned to produce a center-peaked plasma density profile above the surface of the substrate 20. In contrast, a side antenna coil 42 delivers RF power in proportionally greater amounts to the outer perimeter region 17b of cavity 16. If used by itself, side antenna coil 42 is configured and positioned to produce a center-hollow plasma density profile above the surface of substrate 20. When the two antennas 40, 42 are operated together and the RF power is appropriately divided among them, their superposition or vector sum, produces a uniform plasma density profile across the top of the substrate 20. While this configuration is preferred, the top coil 40 can be sized to provide a uniform plasma density across the surface of a substrate.

Antenna coils 40, 42 are driven from an RF power source which, in the present embodiment, includes a single RF generator 70. The RF generator 70, which preferably has a 50 ohm output impedance, is connected through a 50 ohm coaxial cable 62 to a power splitter 71 and then to two RF matching networks 72, 73 via two output lines 68a, 68b, one connected to the matching network 72 and the other connected to matching network 73.

In general, the RF matching networks 72, 73 include one or more variable reactive elements (e.g., inductors or capacitors) by which the impedance of each RF matching network can be adjusted to achieve a match condition between the power splitter 71 and the antenna coils 40, 42 to thereby maximize the RF power that is delivered to the plasma within the chamber. An RF detector circuit within RF matching networks 72, 73 monitors the power transferred into the chamber and generates therefrom control signals which achieve and maintain a match condition.

The design and construction of the RF matching networks 72, 73 which are used in plasma processing systems are well known to persons skilled in the art. A suitable RF matching network is described in U.S. Pat. No. 5,392,018 to Collins et al., and is incorporated herein by reference. Power splitter 71 splits the RF power from the single RF generator 70 into two loads, while maintaining a desired phase relationship between the currents or voltages in the loads. A suitable RF power splitter 71 is described in U.S. Pat. No. 5,349,313 to Collins et al., and is incorporated herein by reference.

Referring again to FIG. 1, a gas nozzle 300 or other gas inlet is centered over the electrostatic chuck assembly 18 and extends through the dielectric plate 14. A top antenna 40 is provided with a central passage through which the gas inlet 300. The top antenna coil 40 configurations described herein are preferably used to advantage with side antenna coils 42 as described above. However, the top antenna coils 40 may also be used independently from a side antenna coil 42.

As substrate sizes increase, gas distribution and uniform plasma density become more difficult to achieve. The gas inlet 300 disposed through the lid, in combination with the top antenna coil configurations shown in FIGS. 2–4, provides uniform gas distribution and plasma density over larger substrates, e.g., 300 mm substrates. The top antenna coil 40, in combination with a side antenna coil 42, located around the cylindrical dome 10 as shown and described above, enhances uniform plasma density over larger substrates. However, both larger and smaller substrates can be processed with top antenna coil 40 in accordance with the present invention.

FIG. 2 schematically depicts a top view of one embodiment of a top antenna coil 40 configuration having two annular coil turns, namely a central coil turn 302 and a concentric outer coil turn 304. The annular coil turns 302 and 304 are connected by a plurality of radially extending conductors 306 which inductively couple power into the processing region 16 to generate a plasma above the substrate. The central coil turn 302 defines a central inlet passage 308 in the top antenna coil 40 through which gas inlet 300 extends into the chamber. An RF generation system including an RF source 316 and an RF match network 318 supplies RF power to the central coil turn 302 by an antenna connection 310, and the outer coil turn 304 is grounded by a ground connection 312. Preferably, the top antenna coil 40 is made of a copper wire or other highly conductive material which can be easily configured.

FIG. 3 schematically depicts a top view of an alternative embodiment of a top antenna coil 40 having two concentric annular coil turns 302 and 304 like the embodiment shown in FIG. 2, except that the conductors 306 connecting the central coil turn 302 and the outer coil turn 304 extend in an arcuate path instead of a radial path.

FIG. 4 shows a top view of still another embodiment of a top antenna coil 40 configuration defining a central passage 308 through which a gas inlet 300 may extend. In this embodiment, a partial ring or loop type coil 309 is positioned around the central passage 308, preferably in concentric alignment with the electrostatic chuck 18. The diameter of the loop 309 can be selected to maximize the desired profile of the plasma for a specific substrate size. For example, a smaller loop diameter generates a center peaked plasma and can be used to advantage with an independently controlled side antenna coil 42 located around the cylindrical dome 10 of the chamber. A cusped plasma density profile may be established by a loop type coil 309 having a diameter approaching the edge of the substrate, e.g., a 100 mm loop used in connection with a 200 mm substrate.

Each of the top antenna coils 40 shown in FIGS. 2–4 can be independently biased as described above so that the power applied to both the side antenna 42 and top antenna 40 can be manipulated to generate a uniform plasma density profile above the entire surface of a substrate. The power supplied to each antenna 40, 42 may also be increased or decreased to couple more or less energy into the processing region, altering the plasma density profile. In addition, the top antenna coils 40 described may be used without a side antenna coil 42.

While the foregoing is directed to the preferred embodiment of the present invention, other and further embodiments of the invention may be devised without departing from the basic scope thereof, and the scope thereof is determined by the claims which follow.

What is claimed is:

1. A chamber for processing a substrate, comprising:
   a) a chamber body comprising a top and sidewalls defining a plasma cavity and a gas inlet centrally located in the top of the chamber; and
   b) a top antenna mounted in the top of the chamber body, the top antenna comprising a central coil turn defining a central passage in the top antenna, an outer coil turn concentrically aligned with the central coil turn, and a plurality of inductors extending between the central coil turn and the outer coil turn.

2. The chamber of claim 1, wherein the gas inlet passes through the central passage in the top antenna.

3. The chamber of claim 1, wherein the inductors extend in a radial path between the central coil turn and the outer coil turn.

4. The chamber of claim 1, wherein the inductors extend in an arcuate path between the central coil turn and the outer coil turn.

5. The chamber of claim 1, further comprising:
   c) a side antenna configured and positioned relative to the plasma cavity to produce a hollow-center plasma density profile above a substrate during operation.

6. The chamber of claim 5, further comprising:
   d) an RF power generator; and
   e) an RF power splitter connected to the RF generator.

7. A chamber for processing a substrate, comprising:
   a) a chamber body comprising a top and sidewalls defining a plasma cavity and, a gas inlet centrally located in the top of the chamber;

b) a top antenna mounted in the top of the chamber body, the top antenna comprising a central coil turn defining a central passage in the top antenna, an outer coil turn concentrically aligned with the central coil turn, and a plurality of inductors extending between the central coil turn and the outer coil turn;

c) a side antenna configured and positioned relative to the plasma cavity to produce a hollow-center plasma density profile above a substrate during operation;

d) an RF power generator; and e) an RF power splitter connecting the RF generator to the top and the side antennas.

8. The chamber of claim 7, wherein the inductors extend in a radial path between the central coil turn and the outer coil turn.

9. The chamber of claim 7, wherein the inductors extend in an arcuate path between the central coil turn and the outer coil turn.

* * * * *

UNITED STATES PATENT AND TRADEMARK OFFICE
CERTIFICATE OF CORRECTION

PATENT NO. : 5,800,621

DATED : September 1, 1998

INVENTOR(S) : Fred C. Redeker, Tetsuya Ishikawa

It is certified that error appears in the above-identified patent and that said Letters Patent is hereby corrected as shown below:

In column 1, line 49, please delete "Couple" and replace it with --Coupled--.

In column 2, line 8, please delete "HPD-CVD" and replace it with --HDP-CVD--.

In column 2, line 41, please delete "is" and replace it with --its--.

Signed and Sealed this

Twenty-second Day of June, 1999

*Attest:*

Q. TODD DICKINSON

*Attesting Officer*      Acting Commissioner of Patents and Trademarks